(12) United States Patent
Ostermaier et al.

(10) Patent No.: US 10,126,355 B1
(45) Date of Patent: Nov. 13, 2018

(54) SEMICONDUCTOR PROBE TEST CARD WITH INTEGRATED HALL MEASUREMENT FEATURES

(71) Applicant: Infineon Technologies Austria AG, Villach (AT)

(72) Inventors: Clemens Ostermaier, Villach (AT); Juergen Bostjancic, Ludmannsdorf (AT); Gerhard Raczynski, Landskron (AT); David Kammerlander, Villach (AT); Gerhard Prechtl, St. Jakob i. Rosental (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/592,628

(22) Filed: May 11, 2017

(51) Int. Cl.
    *G01R 31/28* (2006.01)
    *G01R 1/20* (2006.01)
    *G01R 1/073* (2006.01)
    *G01R 33/12* (2006.01)

(52) U.S. Cl.
    CPC ..... *G01R 31/2831* (2013.01); *G01R 1/07342* (2013.01); *G01R 1/20* (2013.01); *G01R 33/12* (2013.01)

(58) Field of Classification Search
    CPC ....... G01R 33/12; G01R 1/20; G01R 1/07342
    See application file for complete search history.

(56) References Cited

U.S. PATENT DOCUMENTS

| | | | |
|---|---|---|---|
| 9,612,274 B2* | 4/2017 | Lee | G01R 31/2805 |
| 2007/0126445 A1* | 6/2007 | Stutzman | G01R 31/2896 324/756.02 |
| 2009/0144971 A1* | 6/2009 | Takekoshi | G01R 1/06722 29/846 |

* cited by examiner

Primary Examiner — Jermele M Hollington
Assistant Examiner — Alvaro Fortich
(74) *Attorney, Agent, or Firm* — Murphy, Bilak & Homiller, PLLC

(57) ABSTRACT

A probe test card for testing semiconductor devices includes a printed circuit board, a pair of electrically conductive probes extending towards one another and protruding away from the printed circuit board with a gap being disposed between ends of the pair of electrically conductive probes, and a coil affixed to and electrically connected to the printed circuit board and disposed directly over the gap. The probe test card is configured to generate a magnetic flux in the gap between the ends of the pair of electrically conductive probes upon the application of a current through the coil.

19 Claims, 4 Drawing Sheets

SEMICONDUCTOR PROBE TEST CARD WITH INTEGRATED HALL MEASUREMENT FEATURES

FIELD OF TECHNOLOGY

The present application relates to semiconductor devices, and in particular relates to semiconductor testing methods and apparatuses.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. An HEMT is a transistor that contains a so-called heterojunction between two materials having different band gaps, such as GaN and AlGaN. In a GaN/AlGaN based HEMT, a two-dimensional electron gas (2DEG) arises near the interface between the AlGaN barrier layer and the GaN buffer layer. In an HEMT, the 2DEG forms the channel of the device. Similar principles may be utilized to select buffer and barrier layers that form a two-dimensional hole gas (2DHG) as the channel of the device. A 2DEG or a 2DHG is generally referred to as a two-dimensional carrier gas. The two-dimensional carrier gas is intrinsically conductive.

Due to the high electron mobility of the two-dimensional carrier gas in the heterojunction configuration, HEMTs offer high conduction and low losses in comparison to many conventional semiconductor transistor designs. These advantageous conduction characteristics make HEMTs desirable in applications including, but not limited to, use as switches in power supplies and power converters, electric cars, air-conditioners, and in consumer electronics, for example.

In an HEMT, the charge carrier density of the two-dimensional carrier gas that provides the channel of the device is an important performance parameter. For this reason, it is desirable to test the charge carrier density of the two-dimensional carrier gas of HEMT devices under manufacture. Conventionally, this kind of measurement has only been possible on bare semiconductor wafers. That is, it has not been possible up to date to measure the charge carrier density of individual integrated circuits, e.g., discrete HEMTs, during the manufacture of these devices.

SUMMARY

According to an embodiment, a method of testing a semiconductor wafer is disclosed. The method includes providing a semiconductor test apparatus. The semiconductor test apparatus includes a testing platform with a testing site that is configured to secure a semiconductor wafer, and a probe test card affixed to a testing arm. The probe test card includes a pair of electrically conductive probes extending towards one another with a gap between ends of the pair of electrically conductive probes, and a coil disposed over the gap. The method further includes loading a semiconductor wafer that has a plurality of test sites into the testing site of the semiconductor test apparatus. The method further includes moving the semiconductor wafer into a testing position such that the pair of electrically conductive probes contacts a first one of the semiconductor test sites. The method further includes applying a current through the coil thereby generating a magnetic flux towards the first semiconductor test site with the semiconductor wafer in the testing position.

According to an embodiment, a probe test card for testing semiconductor devices is disclosed. The probe test card includes a printed circuit board, a pair of electrically conductive probes extending towards one another and protruding away from the printed circuit board with a gap being disposed between ends of the pair of electrically conductive probes, and a coil affixed to and electrically connected to the printed circuit board and disposed directly over the gap. The probe test card is configured to generate a magnetic flux in the gap between the ends of the pair of electrically conductive probes upon the application of a current through the coil.

According to an embodiment, a semiconductor test apparatus is disclosed. The semiconductor test apparatus includes a testing platform with a testing site that is configured to secure a semiconductor wafer, and a probe test card affixed to a testing arm. The probe test card includes a pair of electrically conductive probes extending towards one another with a gap between ends of the pair of electrically conductive probes, and a coil disposed over the gap. The semiconductor test apparatus further includes first and second power limited supply measurement units. The semiconductor test apparatus is configured to move the semiconductor wafer into a testing position with the electrically conductive probes contacting a semiconductor test site of the semiconductor wafer that is disposed in the testing site, and apply a current through the coil thereby generating a magnetic flux towards the first semiconductor test site with the semiconductor wafer in the testing position.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

A probe test card and a method of testing a semiconductor device using the probe test card are described herein. Advantageously, the probe test card includes an integrated electromagnet that enables hall measurement on individual semiconductor devices under manufacture. Conventionally, hall measurements are not performed using semiconductor probing test apparatus. Instead, hall measurements require dedicated test equipment that is configured to generate the necessary magnetic fields for the hall measurement. These measurements can only be done to bulk wafers before device processing beings. By contrast, the probe test card design described herein advantageously enables hall measurements of using conventional wafer probing test equipment. The integrated electromagnet of the probe test card is configured to generate a magnetic flux that is sufficient to perform a hall measurement using the power limited source measurement units of the semiconductor probing test apparatus. The hall measurements can measure the charge carrier density of the two-dimensional carrier gas of an HEMT device under manufacture. According to an embodiment of the probe test card, the integrated electromagnet includes a coil and a ferromagnet with a tapered end at one end of the coil. These features generate a high magnetic flux in the region of the testing probes.

Figure 1:
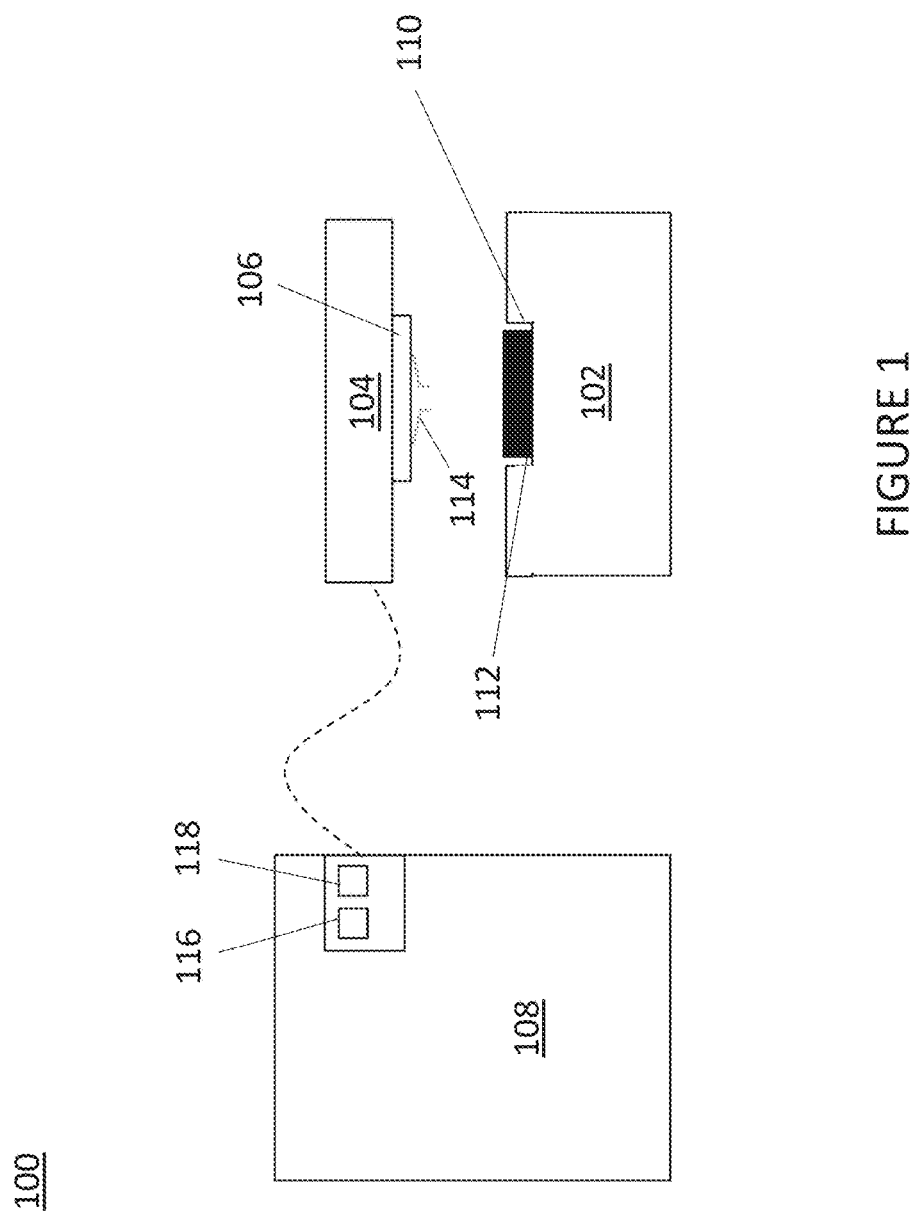
FIG. 1 illustrates a semiconductor probing test apparatus, according to an embodiment.

Referring to FIG. 1, the basic configuration of a commercially available semiconductor probing test apparatus 100 is depicted. The semiconductor probing test apparatus 100 includes a testing platform 102, a testing arm 104 with a probe test card 106 connected thereto, and an IC tester 108. The testing platform 102 includes a wafer site 110 for the placement of a semiconductor wafer 112 that is under manufacture. The wafer site 110 can be a receptacle that is dimensioned to receive a standard sized semiconductor wafer 112. More generally, the wafer site 110 can include any mechanism that will keep the semiconductor wafer 112 in place.

The semiconductor wafer 112 includes a number of individual integrated circuits, i.e., semiconductor dies, as well as a number of testing sites. Generally speaking, a testing site can be provided by a pair of contact locations on the semiconductor wafer 112 that provide a response to a stimulus indicating an electrical property of the semiconductor device under test. These contact locations may be electrically connected to test structures that are disposed at the periphery of each integrated circuit, e.g., in between the scribe lines of the wafer. Alternatively, these contact locations may be electrically connected to the active components of the semiconductor devices. The semiconductor wafer 112 may include a number of testing sites, and may include a testing site corresponding to each die.

The working principle of the semiconductor probing test apparatus 100 is as follows. Once the semiconductor wafer 112 is placed in the wafer site 110, the semiconductor wafer 112 is moved into a testing position such that probes 114 from the probe test card 106 directly contact the terminals of one of the testing sites on the semiconductor wafer 112. Subsequently, a testing process is carried out by the IC tester 108. An electrical and communicative connection exists between the IC tester 108 and the testing arm 104. The probe test card 106 includes a printed circuit board with controllable integrated circuits. These controllable integrated circuits are in communication with the IC tester 108 via the electrical and communicative connection. As a result, the probe test card 106 can perform any of a wide variety of test functions based upon control signaling from the IC tester 108.

The IC tester 108 includes supply measurement units. The supply measurement units (also sometimes referred to as "source measurement units") are electronic instruments that are capable of delivering current to a testing site while simultaneously measuring an electrical parameter of the testing site. That is, a supply measurement unit can deliver voltage and/or current to a load and simultaneously measure the voltage and/or current across the load. One of these supply measurements can therefore be used to deliver an electrical current and/or voltage to the probes 114, and measure the IV characteristics of a testing site that is connected to the probes 114. In the depicted example, the IC tester 108 includes first and second supply measurement units 116, 118. However, this is just an example. Generally speaking, the semiconductor probing test apparatus 100 can include any number of supply measurement units.

Figure 2:
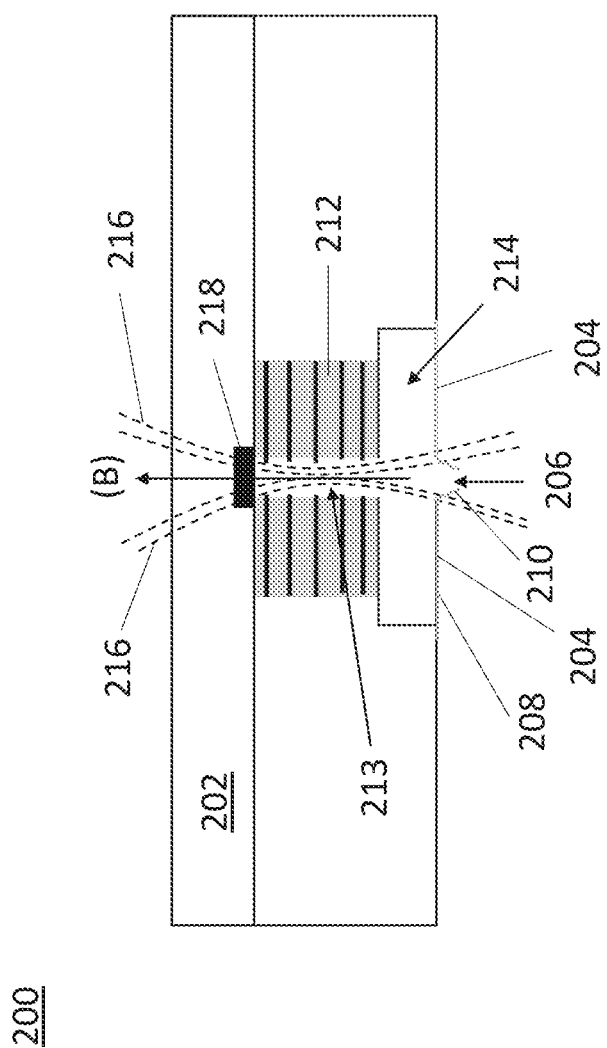
FIG. 2 illustrates a semiconductor probe test card that is compatible with a semiconductor probing test apparatus, according to an embodiment.

Referring to FIG. 2, a probe test card 200 that is compatible with the commercially available semiconductor probing test apparatus 100 described with reference to FIG. 1 is depicted. The probe test card 200 includes a printed circuit board 202. The printed circuit board 202 includes a number of controllable integrated circuits that are compatible with the IC tester 108. That is, the printed circuit board 202 is configured to perform a variety of functions based upon control signaling that is generated by the IC tester 108.

The probe test card 200 further includes a pair of electrically conductive probes 204 that are connected to the printed circuit board 202. The electrically conductive probes 204 can be made from a variety of electrically conductive materials, such as tungsten. The electrically conductive probes 204 extend towards one another and protrude away from the printed circuit board 202. Moreover, a gap 206 exists between the ends of the electrically conductive probes 204. This distance of this gap 206 corresponds to the separation distance between the contact location of a semiconductor wafer 112 test site. In the depicted embodiment, the electrically conductive probes 204 include first sections 208 that are substantially parallel to an underside of the printed circuit board 202, and second sections 210 that bend away from the first sections. This configuration represents just one of a variety of probe configurations. More generally, the electrically conductive probes 204 can have any geometry that enables contact with the testing site of the semiconductor wafer 112 when the semiconductor probing test apparatus 100 is in the testing position. Moreover, the number of electrically conductive probes 204 may vary. For example, according to one embodiment, the probe test card 200 includes three pairs of the probes that are adjacent to one another and run parallel to one another.

The probe test card 200 further includes a coil 212. The coil 212 includes an electrically conductive wire that is spiral wound in a number of turns, e.g., 5, 10, 15, etc. The coil 212 is electrically connected to the printed circuit board 202. The coil 212 is affixed to the probe test card 200 in such a way that the coil 212 will remain stationary when the probe test card 200 is above the wafer 112 in the testing position. The coil 212 is disposed directly over the gap 206 between the ends of the electrically conductive probes 204. That is, the coil 212 overlaps with the gap 206 between the ends of the electrically conductive probes 204 when seen from above or below. According to an embodiment, the coil 212 is provided directly over an opening 214 of the probe test card 200. The opening 214 can be a recessed portion in the underside of the probe test card 200. The pair of electrically conductive probes 204 are affixed to the underside outside of the opening 214 and laterally extend over the opening 214. That is, the pair of electrically conductive probes 204 overhang over the opening 214.

The probe test card 200 is configured to generate a magnetic flux in the presence of a current that is forced through the coil 212. As is commonly known, when electrical current flows through an electrical conductor, a magnetic field develops around the conductor in a direction that is perpendicular to the flow of current. This principle is used to generate a magnetic flux in the gap 206 between the ends of the pair of electrically conductive probes 204 by forcing a current through the coil 212.

Representative magnetic field lines 216 that arise when a current is flowing through the coil 212 are depicted. A magnetic field vector (B) extending through the center of the coil corresponds to a direction that is perpendicular to the current in the coil. As can be seen, the coil 212 includes an air gap 213 at a center of the coil 212. The magnetic field is substantially perpendicular to the vector magnetic field vector (B) in this air gap 213. 213 Once the magnetic field exits the coil 212, it tends to curve outward and eventually back towards the coil 212 in a loop. The result is a magnetic flux (i.e., magnetic field density) that is highly concentrated in the air gap 213, and at locations that are very close to the air gap 213, including the general vicinity of the ends of the pair of electrically conductive probes 204. The opening 214 in the probe test card 200 serves to confine and direct a magnetic field generated by the coil 212 towards the gap 206 between the ends of the pair of electrically conductive probes 204.

According to an embodiment, the probe test card 200 includes a magnetic flux sensor 218 that is configured to measure the magnetic flux generated by the coil 212 during the testing. The magnetic flux sensor 218 can measure the magnetic flux present while the current is flowing through the coil 212, and after the current has been removed, i.e., the magnetic remanence of the coil 212. In the depicted embodiment, the magnetic flux sensor 218 is disposed immediately above the coil 212. More generally, the magnetic flux sensor 218 can be disposed at any location in which the magnetic field generated by the probe test card 200 is detectable.

Figure 3:
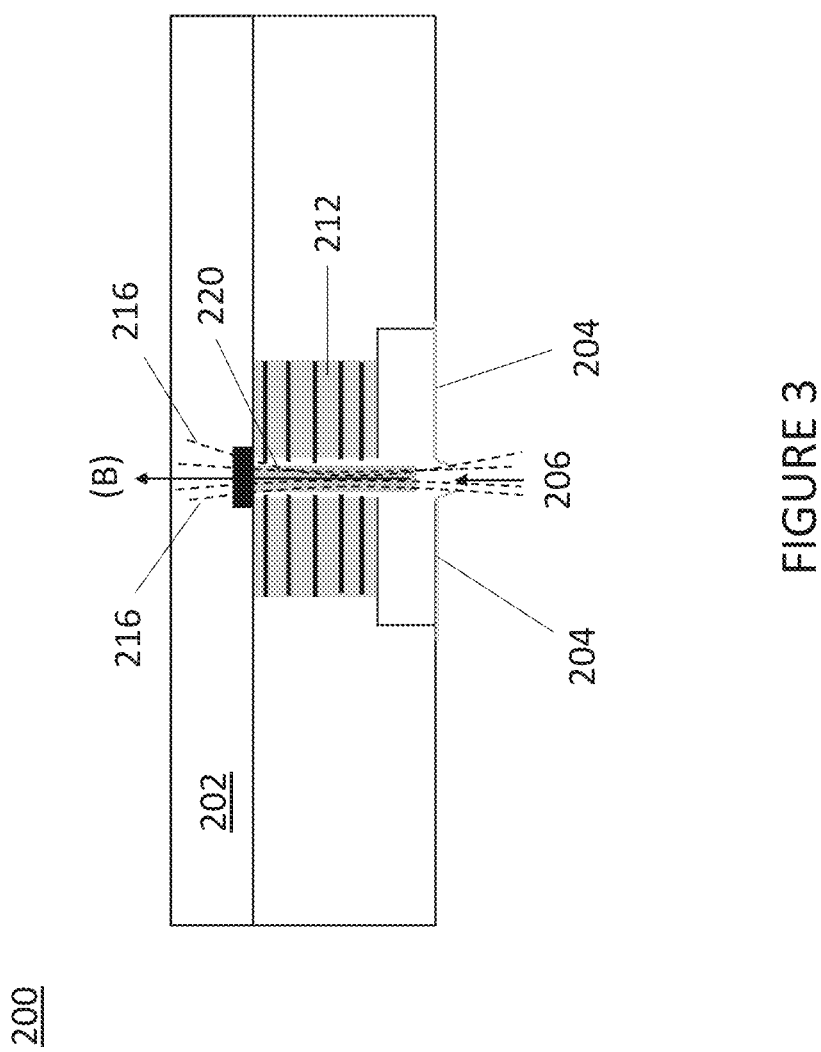
FIG. 3 illustrates a semiconductor probe test card that is compatible with a semiconductor probing test apparatus, according to another embodiment.

Referring to FIG. 3, a probe test card 200 is depicted, according to another embodiment. The probe test card 200 of FIG. 3 is identical to the probe test card 200 described with reference to FIG. 2 with the exception that it additionally includes a magnet 220 disposed in the centrally located air gap 213 of the coil 212. The magnet 220 is disposed directly over the gap 206 between the electrically conductive probes 204. According to an embodiment, the magnet 220 has an elongated cylindrical shape, and extends completely thorough the coil 212 and into the opening 214 of the probe test card 200. More generally, the magnet 220 can have any elongated shape that increases the linearity of the magnetic field at the gap 206 between the probes in comparison to a similar device without any magnet 220. In general, the magnet 220 can be formed from any ferromagnetic material, such as iron, nickel, cobalt and alloys thereof. The magnet 220 can be a permanent magnet, meaning that it intrinsically generates a magnetic field without any electrical current passing through it.

As can be seen comparing the magnetic field lines 216 in FIG. 3 with the magnetic field lines 216 in FIG. 2, the magnetic field is compressed. In comparison to a configuration with only ambient air at the center of the coil 212, the presence of the magnet 220 causes the magnetic field lines to remain closer to parallel with the magnetic field vector (B) as it exits the coil 212. As a result, the flux of the magnetic field is increased at the gap 206 between the electrically conductive probes 204, and the magnetic field is less dispersed in this region.

Figure 4:
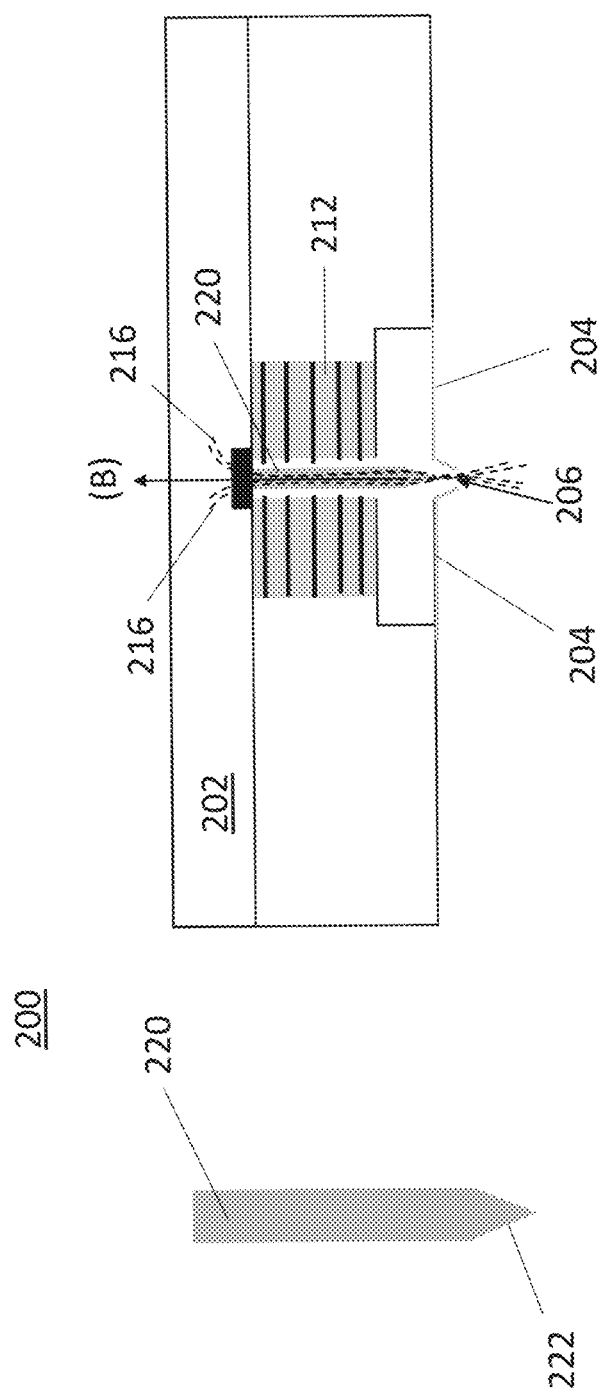
FIG. 4 illustrates a semiconductor probe test card that is compatible with a semiconductor probing test apparatus, according to another embodiment.

Referring to FIG. 4, a probe test card 200 is depicted, according to another embodiment. The probe test card 200 of FIG. 4 is identical to the probe test card 200 described with reference to FIG. 3 with the exception that the shape of the magnet 220 has been modified. An enlarged view of the magnet 220 is shown on the left side of the figure. In this embodiment, the magnet 220 includes a tapered end 222. In the depicted embodiment, the magnet 220 includes a transition between a cylindrical portion and a triangular end portion, i.e., the tapered portion. More generally, the tapering can have any geometry in which the thickness of the magnet 220 gradually diminishes and ultimately forms a generally pointed or narrowed portion at one end of the magnet 220.

As can be seen comparing the magnetic field lines 216 in FIG. 4 with the magnetic field lines 216 in FIG. 3, the taper of the magnet 220 compresses the magnetic field to an even greater degree at one end of the magnet 220. Moreover, this tapered end of the magnet 220 is disposed very close to the gap 206 between the electrically conductive probes 204. As a result, the flux of the magnetic field at the gap 206 between the electrically conductive probes 204 is further increased in comparison to the previously described embodiments.

Advantageously, the embodiments of the probe test card 200 described with reference to FIGS. 2-4 are configured to perform a hall measurement using standard power supplies that are available in the commercially available semiconductor probing test apparatus 100 described with reference to FIG. 1. Hall measurement refers to a semiconductor testing technique whereby electrical current is forced through a sample specimen with the sample specimen being subjected to a magnetic field that is perpendicular to the current. This produces a voltage (i.e., the "hall voltage") in the sample specimen that is perpendicular to both the current and the magnetic field. This hall voltage is measured by the testing apparatus. Typically, in a hall measurement, the polarity of the current is reversed in an alternating fashion, and the corresponding changes in hall voltage are measured. A hall measurement can be used to extrapolate a variety of different device parameters for the sample specimen, such as carrier mobility, carrier concentration, Hall coefficient, resistivity, and magnetoresistance to name a few. In the context of a type III semiconductor nitride semiconductor device, carrier concentration is an important parameter that indicates device performance, as it determines how much current the two-dimensional carrier gas can accommodate.

A hall measurement using the probe test card 200 can be performed as follows. A semiconductor probing test apparatus 100 is outfitted with the probe test card 200 described with reference to FIGS. 2-4. The wafer 112 is moved into the testing position such that the pair of electrically conductive probes 204 contacts a first semiconductor wafer test site. The first semiconductor wafer test site can include a test structure that is specifically configured for hall measurement. An example of such a structure is a so-called hall bar. With the electrically conductive probes 204 in contact with the first semiconductor wafer test site, a current is forced through the coil 212. This current can be supplied from the first supply measurement unit 116 of the IC tester 108. This current generates a magnetic flux towards the first semiconductor wafer 112 site 110. Subsequently, a current is forced through the first semiconductor wafer 112 site 110 via the pair of electrically conductive probes 204. This current can be supplied by the second supply measurement units of the IC tester 108. With the magnetic flux being generated by the coil 212 and the current being forced through the first semiconductor wafer test site, a voltage across the semiconductor first semiconductor wafer test site, i.e., the hall voltage, is measured. This voltage measurement can be performed by the second supply measurement unit 118 of the IC tester 108. After performing this measurement, the wafer and/or the testing arm 104 can be repositioned and an analogous testing procedure can be performed on a second semiconductor wafer test site that is different from the first semiconductor wafer test site.

According to an embodiment, the semiconductor probing test apparatus 100 and the probe test card 200 described herein are used to perform a hall measurement on a type III semiconductor wafer. Examples of these wafers include GaN, GaAs based semiconductor wafers which include a heterojunction with a different band gap material, e.g., AlGaN, InGaN, etc., and thus a two-dimensional carrier gas is present near this material interface. The hall measurement described herein can be used to determine, among other things, the charge carrier density of the two-dimensional carrier gas in the substrate.

Conventionally, hall measurements are performed using specific test equipment that is different from the above described semiconductor probing test apparatus 100. Hall measurement specific test equipment must include, among other things, a magnetic source that is capable of generating sufficiently dense magnetic fields to perform a hall measurement. A standard hall measurement for, e.g., silicon based semiconductor wafer, requires a magnetic flux of approximately at least 1 Tesla. This magnetic flux requires a substantial amount of current and/or voltage.

The power sources provided in standard semiconductor test equipment used for process control are ill suited to generate magnetic fluxes in the range of 1 Tesla or more, as they are power limited. For example, the first and second supply measurement units 116, 118 described herein are typically power limited to 10 Watts in a typical semiconductor probing test apparatus 100. Thus, the first and second supply measurement units 116, 118 can generate a voltage of 200V (volts) with a current of no more than 50 mA (milliamps) in a supply measurement unit with a rated maximum of 10 Watts. Any further increase in voltage requires a proportional decrease in current, and vice-versa. More generally, the first and second supply measurement units 116, 118 of the IC tester 108 described herein can have a maximum power rating of 20 W. This power amount is substantially lower than the power sources that would be needed in hall measurement specific test equipment.

Embodiments of the probe test card 200 described herein can generate a magnetic flux in the gap 206 between the ends of the pair of electrically conductive probes 204 (i.e., the location which requires the magnetic field for the hall measurement) in the range of 0.05 to 0.2 Tesla with a current of between 0.25 Amperes and 0.75 Amperes flowing through the coil 212. The direction of this current, and hence the direction of the magnetic flux, can be reversed. According to one particular embodiment, the probe test card 200 described herein can generate a magnetic flux in the gap 206 between the ends of the pair of electrically conductive probes 204 of approximately 0.1 Tesla with a current of approximately 0.5 Amperes flowing through the coil 212. While these values may be insufficient to perform a standard hall measurement on a silicon based devices, this magnetic flux is sufficient to perform hall measurements on the two-dimensional charge carrier gas of a type III semiconductor wafer 112.

Terms such as "same," "match," and "matches" as used herein are intended to mean identical, nearly identical or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first," "second," and the like are used to describe various elements, regions, sections, etc., and are also not intended to be limiting. Like terms refer to like elements throughout the description.

Spatially relative terms such as "under," "below," "lower," "over," "upper," and the like are used for ease of description to explain the positioning of one element relative to a second element. These terms are intended to encompass different orientations of the device in addition to different orientations than those depicted in the figures. Further, terms such as "first," "second," and the like are also used to describe various elements, regions, sections, etc. and are also not intended to be limiting. Like terms refer to like elements throughout the description.

As used herein, the terms "having," "containing," "including," "comprising," and the like are open ended terms that indicate the presence of stated elements or features, but do not preclude additional elements or features. The articles "a," "an," and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of testing a semiconductor wafer, the method comprising:
    providing a semiconductor test apparatus, the semiconductor test apparatus comprising:
        a testing platform with a wafer site that is configured to secure a semiconductor wafer;
        a probe test card affixed to a testing arm, the probe test card comprising a pair of electrically conductive probes extending towards one another with a gap between ends of the pair of electrically conductive probes, and a coil disposed over the gap;
    loading the semiconductor wafer that comprises a plurality of test sites into the wafer site of the semiconductor test apparatus;
    moving the semiconductor wafer into a testing position such that the pair of electrically conductive probes contacts a first one of the semiconductor test sites; and
    applying a current through the coil thereby generating a magnetic flux towards the first semiconductor test site with the semiconductor wafer in the testing position.

2. The method of claim 1, further comprising:
    performing a hall measurement on the first semiconductor test site while the magnetic flux is generated.

3. The method of claim 2, wherein the semiconductor test apparatus comprises first and second power limited supply measurement units, and wherein performing the hall measurement comprises:
    using the first power limited supply measurement unit to supply current to the coil thereby generating the magnetic flux; and
    using the second power limited supply measurement unit to supply current to the pair of electrically conductive probes and to measure a potential difference across the first semiconductor test site.

4. The method of claim 3, wherein a maximum power generated by each of the first and second power limited supply measurement units is no greater than 20 W, and wherein the coil generates a magnetic flux of at least 0.05 Tesla.

5. The method of claim 4, wherein the coil generates a magnetic flux of no greater than 0.2 Tesla.

6. The method of claim 2, wherein the semiconductor wafer is a type III semiconductor wafer comprising a two-dimensional carrier gas, and wherein performing the hall measurement comprises measuring a charge carrier density of the two-dimensional carrier gas.

7. The method of claim 2, wherein the probe test card further comprises a magnet in a central region of the coil and disposed over the gap, and wherein the magnet increases the magnetic flux in the gap when the current is applied through the coil.

8. The method of claim 1, further comprising:
moving the testing arm or the semiconductor wafer such that the pair of electrically conductive probes contacts a second one of the semiconductor test sites; and
performing a hall measurement on the second semiconductor test site based upon a magnetic field that is generated by the coil.

9. A probe test card for testing semiconductor devices, the probe test card comprising:
a printed circuit board;
a pair of electrically conductive probes extending towards one another and protruding away from the printed circuit board with a gap being disposed between ends of the pair of electrically conductive probes; and
a coil affixed to and electrically connected to the printed circuit board and disposed directly over the gap,
wherein the probe test card is configured to generate a magnetic flux in the gap between the ends of the pair of electrically conductive probes upon the application of a current through the coil.

10. The probe test card of claim 9, wherein the probe test card is configured to perform a hall measurement on a semiconductor test site that is in contact with the probes while the magnetic flux is generated.

11. The probe test card of claim 10, further comprising a magnet disposed over the gap and in a central region of the coil, wherein the magnet is configured to compress a magnetic field that is present at the gap between the probes upon the application of current to the coil.

12. The probe test card of claim 11, wherein the magnet is an elongated magnet extending from the printed circuit board towards the gap, wherein the elongated magnet comprises a tapered end being disposed at a side of the magnet that is closest to the gap.

13. The probe test card of claim 12, wherein the probe test card comprises an opening, wherein the pair of electrically conductive probes extend over the opening, and wherein the elongated magnet extends into the opening with the tapered end being disposed in the opening.

14. The probe test card of claim 10, wherein the coil is configured such that the magnetic flux in the gap between the ends of the pair of electrically conductive probes is between 0.05 and 0.2 Tesla with a current of between 0.25 Amperes and 0.75 Amperes flowing through the coil.

15. The probe test card of claim 14, wherein the coil is configured such that the magnetic flux in the gap between the ends of the pair of electrically conductive probes by the coil is approximately 0.1 Tesla with a current of approximately 0.5 Amperes flowing through the coil.

16. A semiconductor test apparatus, comprising:
a testing platform with a wafer site that is configured to secure a semiconductor wafer;
a probe test card affixed to a testing arm, the probe test card comprising a pair of electrically conductive probes extending towards one another with a gap between ends of the pair of electrically conductive probes, and a coil disposed over the gap; and
first and second power limited supply measurement units; wherein
the semiconductor test apparatus is configured to:
move the semiconductor wafer into a testing position with the pair of electrically conductive probes contacting a first semiconductor test site of the semiconductor wafer that is disposed in the wafer site; and
apply a current through the coil thereby generating a magnetic flux towards the first semiconductor test site with the testing arm in the testing position.

17. The semiconductor test apparatus of claim 16, wherein the semiconductor test apparatus is configured to perform a hall measurement on the first semiconductor test site while the magnetic flux is generated.

18. The semiconductor test apparatus of claim 17, wherein the first power limited supply measurement unit is configured to supply the current in the coil that generates the magnetic flux to the first semiconductor test site, and wherein the second power limited supply measurement unit is configured to perform the hall measurement by supplying current to the pair of electrically conductive probes and measuring a potential difference across the first semiconductor test site.

19. The semiconductor test apparatus of claim 18, wherein the first and second power limited supply measurement units are limited to a power supply of below 20 W, and wherein the coil is configured to generate a magnetic flux of between 0.05 Tesla and 0.2 Tesla using power from the first power limited supply measurement unit.

\* \* \* \* \*